United States Patent [19]
Kose

[11] Patent Number: 5,477,085
[45] Date of Patent: Dec. 19, 1995

[54] BONDING STRUCTURE OF DIELECTRIC SUBSTRATES FOR IMPEDANCE MATCHING CIRCUITS ON A PACKAGING SUBSTRATE INVOLVED IN MICROWAVE INTEGRATED CIRCUITS

[75] Inventor: Yasushi Kose, Tokyo, Japan

[73] Assignee: NEC Corporation, Tokyo, Japan

[21] Appl. No.: 348,822

[22] Filed: Nov. 28, 1994

[30]  Foreign Application Priority Data

Nov. 26, 1993 [JP] Japan ................................. 5-296507

[51] Int. Cl.$^6$ ............................. H05K 3/10; H01L 23/12; H01L 25/04
[52] U.S. Cl. .......................... 257/728; 257/773; 257/920; 257/664; 257/777
[58] Field of Search ................................. 257/772, 773, 257/777, 700, 631–634, 728, 920, 664

[56]  References Cited

U.S. PATENT DOCUMENTS

| | | | |
|---|---|---|---|
| 4,839,712 | 6/1989 | Manodaly et al. | 257/728 |
| 5,198,964 | 3/1993 | Ito et al. | 257/675 |
| 5,291,064 | 3/1994 | Kurokawa | 257/714 |
| 5,317,194 | 5/1994 | Sako | 257/777 |
| 5,355,102 | 10/1994 | Kornrumpf et al. | 257/728 |
| 5,371,405 | 12/1994 | Kagawa | 257/664 |
| 5,382,832 | 1/1995 | Buti et al. | 252/777 |

FOREIGN PATENT DOCUMENTS

| | | | |
|---|---|---|---|
| 0008976 | 1/1979 | Japan | 257/700 |
| 0019648 | 2/1981 | Japan | 257/700 |
| 0166755 | 10/1983 | Japan | 257/700 |
| 0078253 | 3/1990 | Japan | 257/700 |
| 3-263001 | 11/1990 | Japan . | |
| 4-132271 | 5/1992 | Japan . | |

Primary Examiner—Rolf Hille
Assistant Examiner—Alexander Oscar Williams
Attorney, Agent, or Firm—Young & Thompson

[57]  ABSTRACT

The present invention provides a bonding structure between a dielectric substrate made of a dielectric material and a packaging substrate made of a heat conductive material involved in microwave integrated circuits. Both the dielectric and heat conductive materials have different coefficients of thermal expansions. The dielectric substrate has a top surface formed thereon with a top metallization pattern constituting impedance matching circuits and a bottom surface being bonded through a soldering agent to the packaging substrate. The bottom surface of the dielectric substrate has a bottom metallization pattern being selectively formed in a predetermined area thereon so that the soldering agent is applied only on the bottom metallization pattern to bond the dielectric and packaging substrates with each other. The bottom metallization pattern may be the same as the top metallization pattern. Alternatively, the bottom metallization pattern may comprise a plurality of almost rectangles aligned in matrix on the bottom surface of the dielectric substrate.

26 Claims, 5 Drawing Sheets

BONDING STRUCTURE OF DIELECTRIC SUBSTRATES FOR IMPEDANCE MATCHING CIRCUITS ON A PACKAGING SUBSTRATE INVOLVED IN MICROWAVE INTEGRATED CIRCUITS

BACKGROUND OF THE INVENTION

The invention relates to an improvement of microwave integrated circuits, and more particularly to an improvement in a bonding structure of dielectric substrates of impedance matching circuits on a packaging substrate for microwave integrated circuits.

The microwave integrated circuits are provided with not only a semiconductor chip but impedance matching circuits on a packaging substrate as illustrated in FIGS. 1A and 1B. The impedance matching circuits are provided on dielectric substrates such as alumina substrates. A semiconductor chip 34 is provided on a center area of a packaging substrate 31. A pair of first and second dielectric substrates 35 and 36 are provided on the packaging substrate 31 at both sides of the semiconductor chip 34 or input and output sides respectively. The first and second dielectric substrates 35 and 36 are provided with first and second impedance matching circuits thereon. The first and second impedance matching circuits comprise first and second metallization patterns 45 and 46 formed on top surfaces of the first and second dielectric substrates 35 and 36. Each of the first and second metallization patterns 45 and 46 on the first and second dielectric substrates 35 and 36 is electrically connected through bonding wires to wire bonding pads 38 provided on the semiconductor chip 34. Each of the first and second dielectric substrates 35 and 36 has a bottom surface which entire area is metallized or covered with a metallized surface 47 as illustrated FIG. 1C. A soldering agent 37 is applied on the bottom metallizied surface 47 of each of the first and second dielectric substrates 35 and 36. The first and second dielectric substrates 35 and 36 are bonded through the soldering agent 37 on the packaging substrate 31.

As described above, in the conventional dielectric substrates for the impedance matching circuits, the top surface of the dielectric substrate is selectively metallized to form metallization patterns or microstrip lines that constitute distribution constant impedance matching circuits. By contrast, the bottom surface of the dielectric substrate is subjected to a full area metallization or entirely covered with a metalilized surface 47 which is bonded through the soldering agent on the surface of the packaging substrate. Namely, the entire bottom surface of the dielectric substrate is securely bonded on the surface of the packaging substrate.

As is well known, the packaging substrate 31 and the first and second dielectric substrates 35 and 36 receive repeatedly a temperature variation by a heat generated in driving the microwave integrated circuits. The packaging substrate 31 has a different coefficient of thermal expansion from that of the first an second dielectric substrates 35 and 36, for that reason the repeated temperature variations in driving the microwave integarted circuits may cause a considerable internal stress between the packaging substrate 31 and the first and second dielectric substrates 35 and 36. The packaging substrate 31 and the dielectric substrate receive such considerable internal stress whenever receipt of any temperature variations due to a heat generation in driving the microwave integrated circuits. The internal stresses generated every times of receipt of the temperature variations are accumulated both in the packaging substrate 31 and in the first and second dielectric substrates 35 and 36. The accumulation in the packaging substrate 31 and the first and second dielectric substrates 35 and 36 of the internal stresses generated whenever receipt of any temperature variations may cause the packaging substrate to be arched and further may results in an increase of a possibility of generation of cracking in the dielectric substrates or a ceramic substrate at a lead portion. The generation of cracking in the dielectric substrate or in the ceramic substrate due to the accumulation of the internal stresses in the packaging substrate and the dielectric substrate may result in a generation of any leakage current or a difficulty in an alignment at a necessary accuracy of the dielectric substrates including the impedance matching circuits to the packaging substrate. This results in a lowering of reliability of the microwave integrated circuits.

From the above, it could be understood that it is require to develop a novel bonding structure between dielectric substrates including impedance matching circuits and the packaging substrate.

SUMMARY OF THE INVENTION

Accordingly, it is a primary object of the present invention to provide microwave integrated circuits having an improved bonding structure between dielectric substrates and a packaging substrate free from any problem as described above.

It is a further object of the present invention to provide a novel bonding structure between dielectric substrates and a packaging substrate in which the bonding structure may permit a relaxation of any internal stress generated by temperature variations.

It is a still further object of the present invention to provide a novel bonding structure between dielectric substrates and a packaging substrate in which the bonding structure may permit the packaging substrate to be free from any generation of bending.

It is a furthermore object of the present invention to provide a novel bonding structure between dielectric substrates and a packaging substrate in which the bonding structure may permit the dielectric substrate to be free from any generation of cracking.

It is a moreover object of the present invention to provide a novel bonding structure between dielectric substrates and a packaging substrate in which the bonding structure may permit the dielectric substrate to be free from any generation of leakage current.

It is yet a further object of the present invention to provide a novel bonding structure between dielectric substrates and a packaging substrate in which the bonding structure may permit facilitation of an alignment of the dielectric substrate on the packaging substrate in a high accuracy.

The above and other objects, features and advantages of the present invention will be apparent from the following descriptions.

The present invention provides a bonding structure between a dielectric substrate made of a dielectric material and a packaging substrate made of a heat conductive material involved in microwave integrated circuits. Both the dielectric and heat conductive materials have different coefficients of thermal expansions. The dielectric substrate has a top surface formed thereon with a top metallization pattern constituting impedance matching circuits and a bottom surface being bonded through a soldering agent to the packaging substrate. The bottom surface of the dielectric substrate has a bottom metallization pattern being selectively formed in a predetermined area thereon so that the soldering agent is applied only on the bottom metallization pattern to bond the dielectric and packaging substrates with each other. The bottom metallization pattern may be the same as the top metallization pattern.

Alternatively, the bottom metallization pattern may comprise a plurality of almost rectangles aligned in matrix on the bottom surface of the dielectric substrate. The bottom surface of the dielectric substrate has an entirely metallized area being covered with a glass film including a plurality of almost rectangular-shaped openings aligned in matrix so that the metallized area is selectively exposed through the openings to form the bottom metallization pattern and that the soldering agent is applied only on the exposed parts of the metallized area.

In any event, to achieve the above objects, the present invention provides a novel bonding structure of the dielectric substrate and the packaging substrate wherein the dielectric substrate has a considerably reduced bonding area on which a soldering agent is applied to bond the dielectric substrate and the packaging substrate.

BRIEF DESCRIPTIONS OF THE DRAWINGS

Preferred embodiments of the present invention will hereinafter fully be described with reference to the accompanying drawings.

DESCRIPTIONS OF THE INVENTION

A first embodiment according to the present invention will be described in which a novel bonding structure between a packaging substrate and dielectric circuits including metallization patterns constituting impedance matching circuits. The bonding structure between a packaging substrate and dielectric circuits according to the present invention is different from the prior art in that a bottom metallization pattern is selectively formed in a predetermined area in a bottom surface of each dielectric substrate.

Figure 1A:
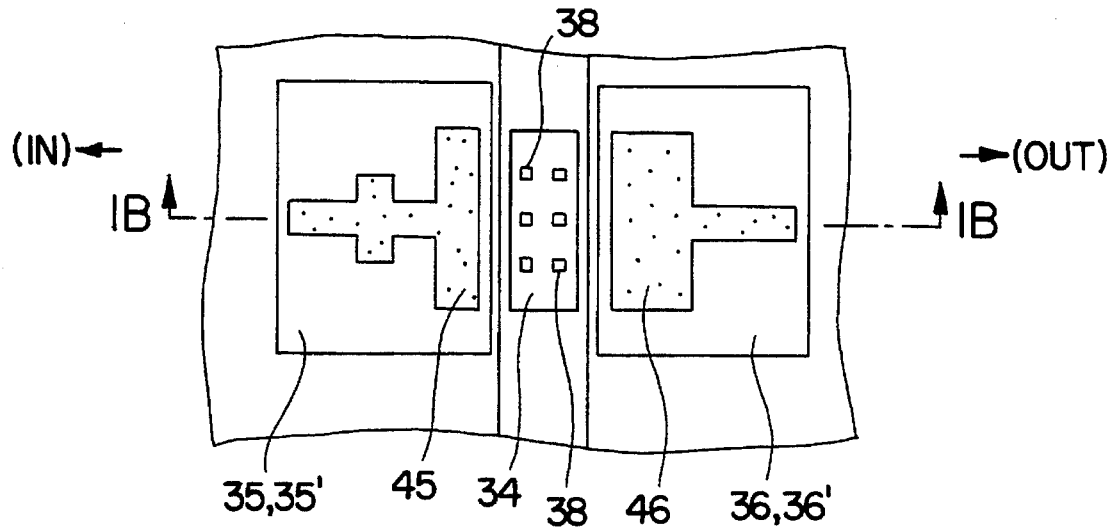
FIG. 1A is a fragmentary plane view illustrative of the conventional microwave integrated circuit structure.
Figure 1B:
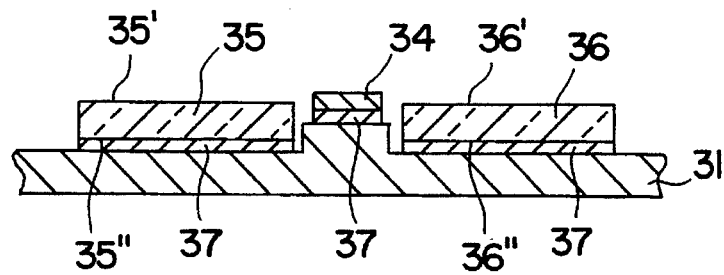
FIG. 1B is a fragmentary cross sectional elevation view illustrative of the conventional microwave integrated circuit structure of FIG. 1A.
Figure 1C:
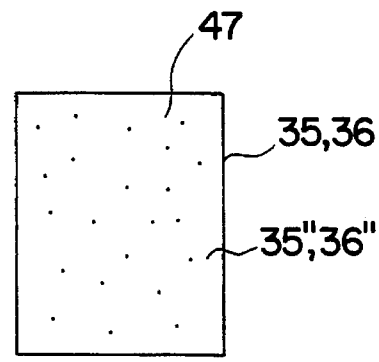
FIG. 1C is a bottom view of a dielectric substrate having a top surface formed thereon with metallization patterns constituting impedance matching circuits.
Figure 2A:
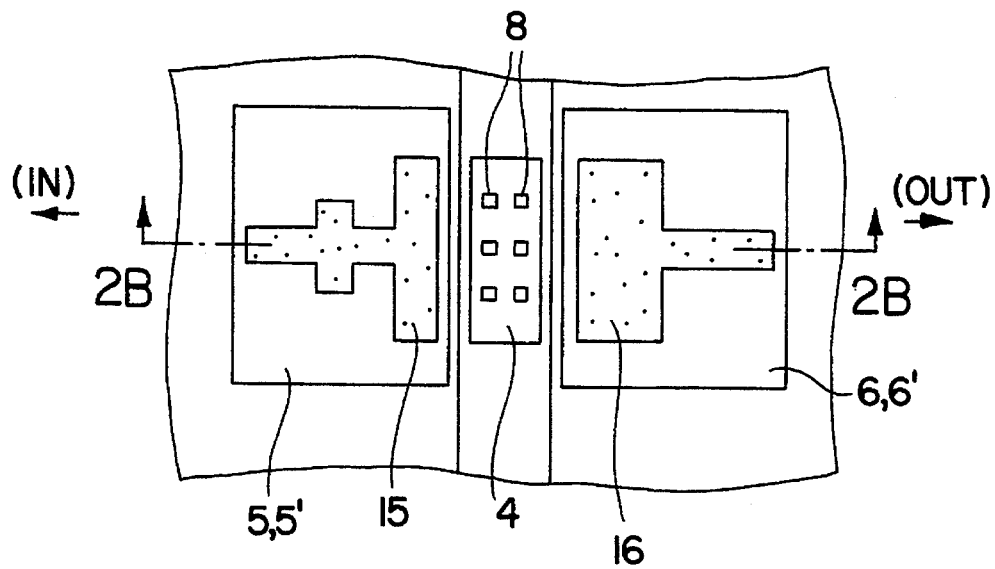
FIG. 2A is a fragmentary plane view illustrative of a novel microwave integrated circuit structure in a first embodiment according to the present invention.
Figure 2B:
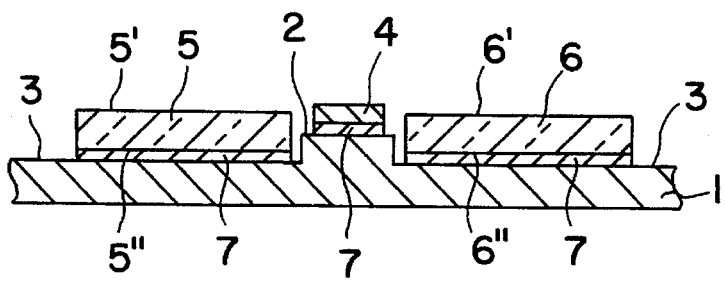
FIG. 2B is a fragmentary cross sectional elevation view illustrative of a novel microwave integrated circuit structure in a first embodiment according to the present invention.

As illustrated in FIGS. 2A and 2B, a semiconductor chip 4 is provided on a center area of a packaging substrate 1. A pair of first and second dielectric substrates 5 and 6 are provided on the packaging substrate 1 at both sides of the semiconductor chip 4 or input and output sides respectively. The first and second dielectric substrates 5 and 6 are provided with first and second impedance matching circuits thereon. The first and second impedance matching circuits comprise first and second top metallization patterns 15 and 16 formed on top surfaces of the first and second dielectric substrates 5 and 6. Each of the first and second top metallization patterns 15 and 16 on the first and second dielectric substrates 5 and 6 is electrically connected through bonding wires to wire bonding pads 8 provided on the semiconductor chip 4. Each of the first and second dielectric substrates 5 and 6 has a bottom surface being selectively formed on a predetermined area thereof with a bottom metallization pattern.

Figure 2C:
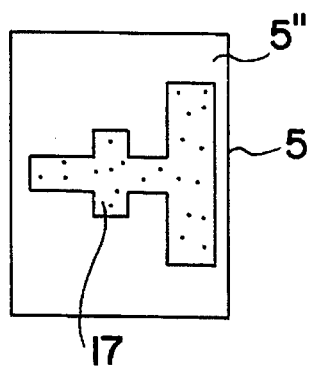
FIG 2C is a top view illustrative of a top surface of a dielectric substrate involved in microwave integrated circuits in which a top metallization pattern constituting impedance matching circuits is formed on the top surface.
Figure 2D:
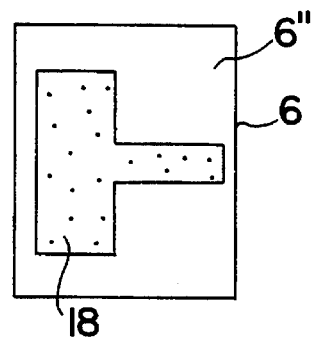
FIG. 2D is a bottom view illustrative of a bottom surface of a dielectric substrate involved in microwave integrated circuits in which a bottom metallization pattern is formed on the bottom surface.
Figure 3A:
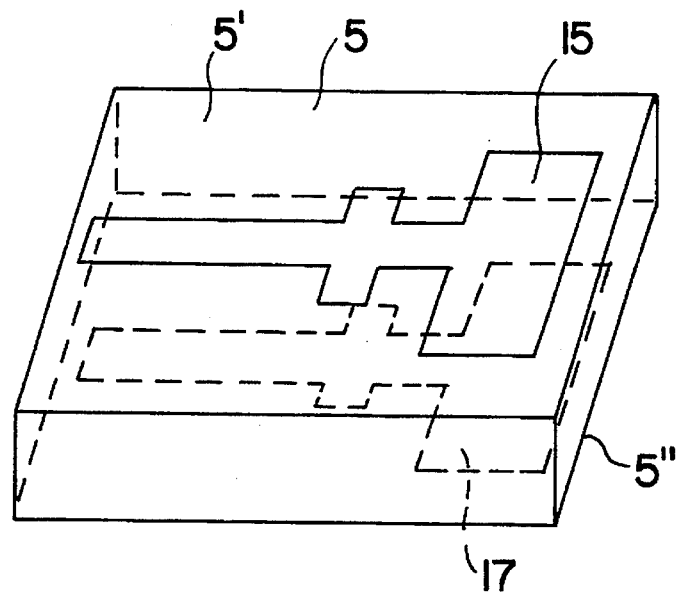
FIG. 3A is an enlarged perspective view illustrative of a first dielectric substrate including a first metallization pattern involved in microwave integrated circuits in a first embodiment according to the present invention.
Figure 3B:
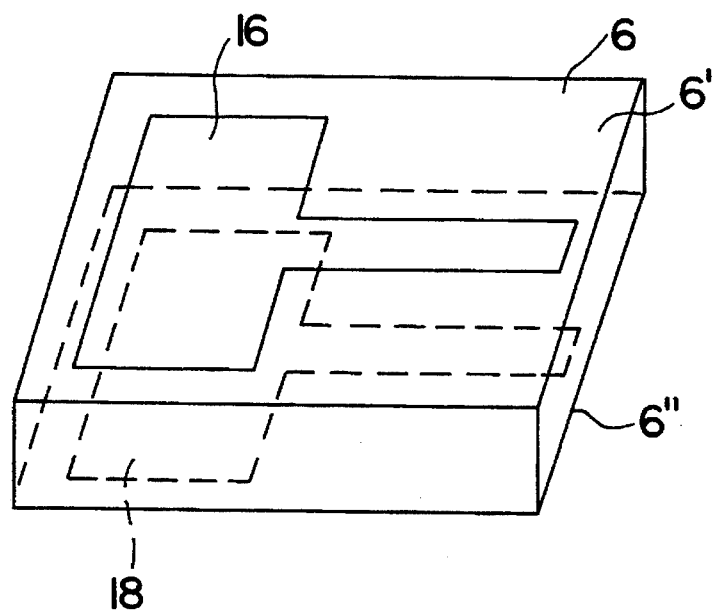
FIG. 3B is an enlarged perspective view illustrative of a second dielectric substrate including a second metallization pattern involved in microwave integrated circuits in a first embodiment according to the present invention.

As illustrated in FIG. 2C, a first bottom metallization pattern 17 selectively formed on a bottom surface of the first dielectric substrate 5 has the same definition as a first top metallization pattern 15 constituting the impedance matching circuits formed on the top surface of the first dielectric substrate 5. As illustrated in FIG. 2D, a second bottom metallization pattern 18 selectively formed on a bottom surface of the second dielectric substrate 6 also has the same definition as a second top metallization pattern 16 constituting the impedance matching circuits formed on the top surface of the second dielectric substrate 6. Consequently, the top and bottom metallization patterns are the same in each of the first and second dielectric substrates 5 and 6.

The packaging substrate 1 is made of a material having a high thermal conductivity such as Cu or CuW, while the semiconductor chip is made of silicon. A soldering agent 7 is applied on the bottom metallization pattern 7 of each of the first and second dielectric substrates 5 and 6. The soldering agent may be made of AuSi or AuSn. The first and second dielectric substrates 5 and 6 are bonded through the soldering agent 7 on the packaging substrate 1. In this embodiment, each of the above metallization patterns 15, 16, 17 and 18 may comprise an Au metallization pattern.

As described above, in the novel dielectric substrates for the impedance matching circuits, the top surface of the dielectric substrate is selectively metallized to form metallization patterns or microstrip lines that constitute distribution constant impedance matching circuits. Similarly, the bottom surface of the dielectric substrate is also selectively metallized to form the same metallization pattern as the top surface metallization pattern. The bottom metallization pattern is securely bonded on the packaging substrate 1 through the soldering agent applied on the bottom metallization pattern. Namely, the novel bonding structure between the dielectric substrate and the packaging substrate has a smaller bonding area defined by the bottom metallization pattern as compared to the prior art in which the entire of the bottom surface of the dielectric substrate is metallized and applied thereon with the soldering agent through which the dielectric substrate and the packaging substrate are securely bonded. The reduction of the bonding area defined by the bottom metallization pattern that is bonded through the soldering agent to the packaging substrate may permit a relaxation of the internal stress generated by temperature variations.

The packaging substrate 1 has a different coefficient of thermal expansion from that of the first an second dielectric substrates 5 and 6, for that reason the repeated temperature variations in driving the microwave integarted circuits may cause different thermal expansions between the packaging substrate 1 and the first and second dielectric substrates 5 and 6. The reduction of the bonding area in the bottom surface of the dielectric substrate may permit the dielectric substrate and the packaging substrate to show almost free thermal expansions different from each other without any accumulation of internal stress therein. Namely, if the dielectric substrate and the packaging substrate receive the temperature variation due to the generation of a heat in driving the microwave integrated circuits, then the novel bonding structure between the packaging substrate and the dielectric substrate through the selectively-formed bottom metallization pattern may permit free expansions of individuals of the packaging substrate and the dielectric substrate. The permission of the individual free thermal expansions may permit the packaging substrate and the dielectric substrate to be free from any accumulation of the internal stress therein. This may further prevent the packaging substrate to be bent and also may permit the dielectric substrate to be free from any generation of cracking or leakage current. Furthermore, the novel bonding structure may permit a facilitation of an alignment of the dielectric substrate on the packaging substrate in a high accuracy. Consequently, the novel bonding structure between the packaging substrate and the dielectric substrate may provide a high reliability to the microwave integrated circuits.

The present invention may of course be applicable to compound semiconductor devices such as GaAsFET wherein a packaging substrate has a plane size of 9.5 mm×13 mm and a thickness of 1.4 mm and is made of Cu and the packaging substrate has the bonding structure of the present invention. The packaging substrate is placed in condition 100 cycles of temperature variations. An amount of the bending of the packaging substrate is suppressed within 30 micrometers. This amount is ½ or ⅓ of an amount of the bending of the conventional device. The packaging substrate also shows an excellent adhesive property so that an output property is improved by 0.4 dB at 12 GHz.

The first embodiment of the present invention provides a further advantage in that the identity between the top and bottom metallization patterns may be formed by use of a single pattern. The identity between the top and bottom metallization patterns may further permit the impedance matching circuits constituted by the top metallization pattern to have almost the same distribution circuit properties as that of the impedance matching circuit including the full area bottom metallization.

A second embodiment according to the present invention will be described in which a novel bonding structure between a packaging substrate and dielectric circuits including metallization patterns constituting impedance matching circuits. The bonding structure between a packaging substrate and dielectric circuits according to the present invention is different from the prior art in that a bottom metallization pattern is selectively formed in a predetermined area in a bottom surface of each dielectric substrate. The novel bonding structure between the packaging substrate and the dielectric substrate in the second embodiment differs from the bonding structure of the first embodiment only in the bottom metallization pattern on the bottom surface of the dielectric substrate. The bottom metallization pattern of the dielectric substrate in the second embodiment is completely different from the top metallization pattern constituting the impedance matching circuits and may comprise, for example, arrays of rectangles aligned in matrix on the bottom surface of the dielectric surface.

Figure 4A:
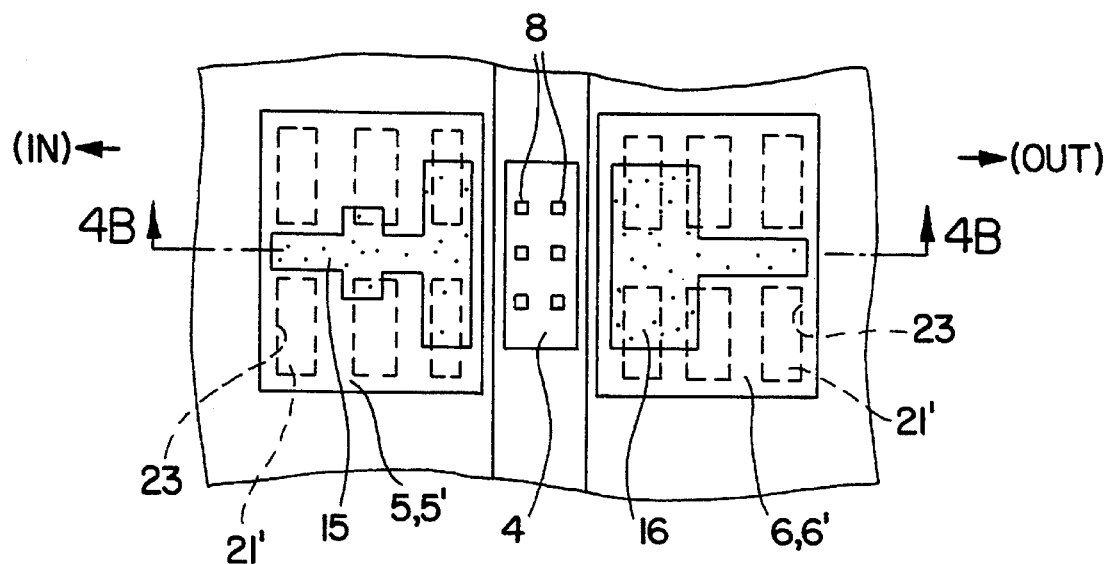
FIG. 4A is a fragmentary plane view illustrative of a novel microwave integrated circuit structure in a second embodiment according to the present invention.
Figure 4B:
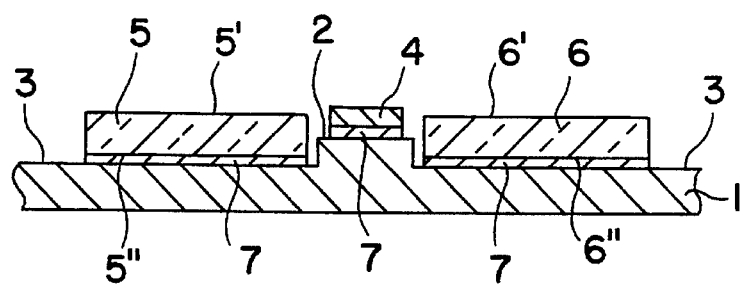
FIG. 4B is a fragmentary cross sectional elevation view illustrative of a novel microwave integrated circuit structure in a second embodiment according to the present invention.

As illustrated in FIGS. 4A and 4B, a semiconductor chip 4 is provided on a center area of a packaging substrate 1. A pair of first and second dielectric substrates 5 and 6 are provided on the packaging substrate 1 at both sides of the semiconductor chip 4 or input and output sides respectively. The first and second dielectric substrates 5 and 6 are provided with first and second impedance matching circuits thereon. The first and second impedance matching circuits comprise first and second top metallization patterns 15 and 16 formed on top surfaces of the first and second dielectric substrates 5 and 6. Each of the first and second top metallization patterns 15 and 16 on the first and second dielectric substrates 5 and 6 is electrically connected through bonding wires to wire bonding pads 8 provided on the semiconductor chip 4. Each of the first and second dielectric substrates 5 and 6 has a bottom surface being selectively formed on a predetermined area thereof with a bottom metallization pattern.

Figure 5A:
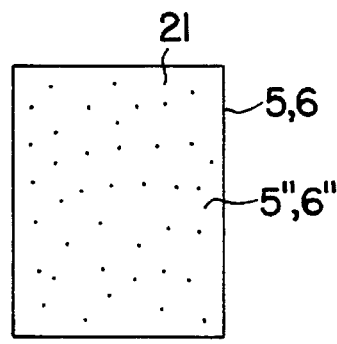
FIG. 5A is a bottom view illustrative of a bottom surface of a dielectric substrate in a fabrication process therefor in a second embodiment according to the present invention.
Figure 5B:
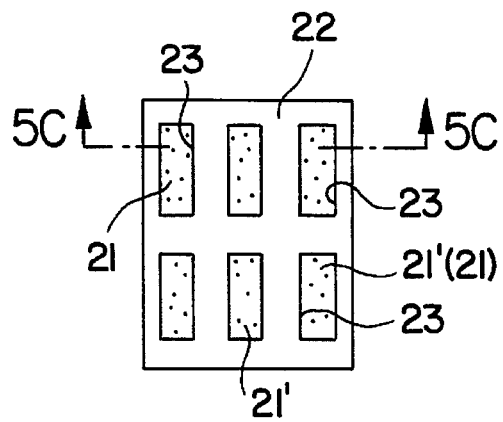
FIG. 5B is a bottom view illustrative of a bottom surface of a dielectric substrate completely fabricated in a second embodiment according to the present invention.
Figure 5C:
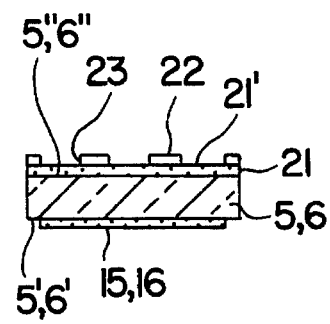
FIG. 5C is a fragmentary cross sectional elevation view illustrative of a dielectric substrate of FIG. 5B.
Figure 5D:
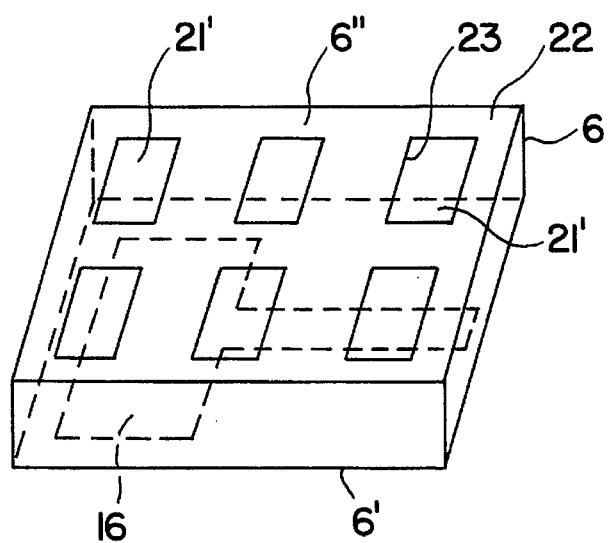
FIG. 5D is an enlarged perspective view illustrative of dielectric substrate including bottom and top metallization patterns involved in microwave integrated circuits in a second embodiment according to the present invention.

As illustrated in FIGS. 5B and 5D, a first bottom metallization pattern 21 selectively formed on a bottom surface of the first dielectric substrate 5 has a different definition from a first top metallization pattern 15 constituting the impedance matching circuits formed on the top surface of the first dielectric substrate 5. A second bottom metallization pattern 21' selectively formed on a bottom surface of the second dielectric substrate 6 also has the same definition as the first top metallization pattern 21 but has a different definition from a second top metallization pattern 16 constituting the impedance matching circuits formed on the top surface of the second dielectric substrate 6. The first and second top metallization patterns 21 and 21' comprise the arrays of rectangles being aligned in matrix on the bottom surfaces of the first and second dielectric substrates 5 and 6. Such top metallization pattern may be formed as follows.

As illustrated in FIG. 5A, the entire of the bottom surface of the dielectric substrate is subjected to a non-selective metallization to form an entirely metallized bottom surface. A glass pattern 22 having a plurality of rectangular-shaped openings 23 being aligned in matrix is covered on the entirely metallized bottom surface so that the metallization bottom surface is selectively exposed through the rectangular-shaped openings 23 as illustrated in FIGS. 5B and 5C. In FIGS. 5C and 5D, the bottom surface of the dielectric substrate faces upward. Soldering agents are bonded only the metallization surface, but not bonded to the glass film. Then, the soldering agents are applied only on the exposed parts of the metallization surface defined by the rectangular-shaped openings 23 aligned in matrix in the glass film 22 overlying the entirely metallized bottom surface of the dielectric substrate. The dielectric substrate is securely bonded through the soldering agent on the packaging substrate.

As described above, in the novel dielectric substrates for the impedance matching circuits, the top surface of the dielectric substrate is selectively metallized to form metallization patterns or microstrip lines that constitute distribution constant impedance matching circuits. The bottom surface of the dielectric substrate is also selectively metallized to form the rectangular-shaped bottom metallization pattern aligned in the matrix defined by the rectangular-shaped openings 23 aligned in the matrix on the glass film 22 covering the bottom surface of the dielectric substrate. The bottom metallization pattern is securely bonded on the packaging substrate 1 through the soldering agent applied on the bottom metallization pattern. Namely, the novel bonding structure between the dielectric substrate and the packaging substrate has a smaller bonding area defined by the bottom metallization pattern as compared to the prior art in which the entire of the bottom surface of the dielectric substrate is metallized and applied thereon with the soldering agent through which the dielectric substrate and the packaging substrate are securely bonded. The reduction of the bonding area defined by the bottom metallization pattern that is bonded through the soldering agent to the packaging substrate may permit a relaxation of the internal stress generated by temperature variations.

The packaging substrate 1 has a different coefficient of thermal expansion from that of the first an second dielectric substrates 5 and 6, for that reason the repeated temperature variations in driving the microwave integarted circuits may cause different thermal expansions between the packaging substrate 1 and the first and second dielectric substrates 5 and 6. The reduction of the bonding area in the bottom surface of the dielectric substrate may permit the dielectric substrate and the packaging substrate to show almost free thermal expansions different from each other without any accumulation of internal stress therein. Namely, if the dielectric substrate and the packaging substrate receive the temperature variation due to the generation of a heat in driving the microwave integrated circuits, then the novel bonding structure between the packaging substrate and the dielectric substrate through the selectively-formed bottom metallization pattern may permit free expansions of individuals of the packaging substrate and the dielectric substrate. The permission of the individual free thermal expansions may permit the packaging substrate and the dielectric substrate to be free from any accumulation of the internal stress therein. This may further prevent the packaging substrate to be bent and also may permit the dielectric substrate to be free from any generation of cracking or leakage current. Furthermore, the novel bonding structure may permit a facilitation of an alignment of the dielectric substrate on the packaging substrate in a high accuracy. Consequently, the novel bonding structure between the packaging substrate and the dielectric substrate may provide a high reliability to the microwave integrated circuits.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the present invention which fall within the sprit and scope of the invention.

What is claimed is:

1. A bonding structure between a first substrate made of a first material and a second substrate made of a second material, said first and second materials having different coefficients of thermal expansions, said first substrate having a first surface selectively formed thereon with a first metallization pattern constituting circuits and a second surface being bonded through a soldering agent to said second substrate;

wherein said second surface of said first substrate has a second metallization pattern being selectively formed in a predetermined area thereon, said soldering agent being applied on said second metallization pattern to bond said first and second substrates with each other; and wherein said second metallization pattern is the same as the first metallization pattern.

2. The bonding structure as claimed in claim 1, wherein said first material of said first substrate is a dielectric material.

3. The bonding structure as claimed in claim 2, wherein said dielectric material is $Al_2O_3$.

4. The bonding structure as claimed in claim 1, wherein said second material of said second substrate is a material having a high heat conductivity.

5. The bonding structure as claimed in claim 4, wherein said second material is selected from the group consisting of Cu and CuW.

6. The bonding structure as claimed in claim 1, wherein said soldering agent is selected from the group consisting of AuSi and AuSn.

7. The bonding structure as claimed in claim 1, wherein said first and second metallization patterns comprise Au metallization patterns.

8. A bonding structure between a first substrate made of a first material and a second substrate made of a second material, said first and second materials having different coefficients of thermal expansions, said first substrate having a first surface selectively formed thereon with a first metallization pattern constituting circuits and a second surface being bonded through a soldering agent to said second substrate;

wherein said second surface of said first substrate has a second metallization pattern being selectively formed in a predetermined area thereon, said soldering agent being applied on said second metallization pattern to bond said first and second substrates with each other; and wherein said second metallization pattern comprises a plurality of almost rectangles aligned in matrix on said second surface of said first substrate.

9. The bonding structure as claimed in claim 8, wherein said second surface of said first substrate has an entirely metallized area being covered with a glass film including a plurality of almost rectangular-shaped openings aligned in matrix so that said metallized area is selectively exposed through said openings to form said second metallization pattern and that said soldering agent is applied only on said exposed parts of said metallized area.

10. The bonding structure as claimed in claim 8, wherein said first material of said first substrate is a dielectric material.

11. The bonding structure as claimed in claim 10, wherein said dielectric material is $Al_2O_3$.

12. The bonding structure as claimed in claim 8, wherein said second material of said second substrate is a material having a high heat conductivity.

13. The bonding structure as claimed in claim 12, wherein said second material is selected from the group consisting of Cu and CuW.

14. The bonding structure as claimed in claim 8, wherein said soldering agent is selected from the group consisting of AuSi and AuSn.

15. The bonding structure as claimed in claim 8, wherein said first and second metallization patterns comprise Au metallization patterns.

16. A bonding structure between a dielectric substrate made of a dielectric material and a packaging substrate made of a heat conductive material involved in microwave integrated circuits, both said dielectric and heat conductive materials having different coefficients of thermal expansions, said dielectric substrate having a top surface formed thereon with a top metallization pattern constituting impedance matching circuits and a bottom surface being bonded through a soldering agent to said packaging substrate;

wherein said bottom surface of said dielectric substrate has a bottom metallization pattern being selectively formed in a predetermined area thereon, said soldering agent being applied on said bottom metallization pattern to bond said dielectric and packaging substrates with each other; and wherein said bottom metallization pattern is the same as the top metallization pattern.

17. The bonding structure as claimed in claim 16, wherein said dielectric material is $Al_2O_3$.

18. The bonding structure as claimed in claim 16, wherein said heat conductive material is selected from the group consisting of Cu and CuW.

19. The bonding structure as claimed in claim 16, wherein said soldering agent is selected from the group consisting of AuSi and AuSn.

20. The bonding structure as claimed in claim 16, wherein said top and bottom metallization patterns comprise Au metallization patterns.

21. A bonding structure between a dielectric substrate made of a dielectric material and a packaging substrate made of a heat conductive material involved in microwave integrated circuits, both said dielectric and heat conductive materials having different coefficients of thermal expansions, said dielectric substrate having a top surface formed thereon with a top metallization pattern constituting impedance matching circuits and a bottom surface being bonded through a soldering agent to said packaging substrate;

wherein said bottom surface of said dielectric substrate has a bottom metallization pattern being selectively formed in a predetermined area thereon, said soldering agent being applied on said bottom metallization pattern to bond said dielectric and packaging substrates with each other; and wherein said bottom metallization pattern comprises a plurality of almost rectangles aligned in matrix on said bottom surface of said dielectric substrate.

22. The bonding structure as claimed in claim 21, wherein said bottom surface of said dielectric substrate has an entirely metallized area being covered with a glass film including a plurality of almost rectangular-shaped openings aligned in matrix so that said metallized area is selectively exposed through said openings to form said bottom metallization pattern and that said soldering agent is applied only on said exposed parts of said metallized area.

23. The bonding structure as claimed in claim 21, wherein said dielectric material is $Al_2O_3$.

24. The bonding structure as claimed in claim 21, wherein said heat conductive material is selected from the group consisting of Cu and CuW.

25. The bonding structure as claimed in claim 21, wherein said soldering agent is selected from the group consisting of AuSi and AuSn.

26. The bonding structure as claimed in claim 21, wherein said top and bottom metallization patterns comprise Au metallization patterns.

\* \* \* \* \*